United States Patent
Wang et al.

(10) Patent No.: US 11,855,235 B2
(45) Date of Patent: Dec. 26, 2023

(54) DISPLAY PANEL AND MANUFACTURING METHOD THEREFOR, AND DISPLAY APPARATUS

(71) Applicant: BOE Technology Group Co., Ltd., Beijing (CN)

(72) Inventors: Chunyang Wang, Beijing (CN); Hejin Wang, Beijing (CN); Liangjian Li, Beijing (CN); Zheng Liu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 421 days.

(21) Appl. No.: 17/295,921

(22) PCT Filed: Aug. 18, 2020

(86) PCT No.: PCT/CN2020/109853
§ 371 (c)(1),
(2) Date: May 21, 2021

(87) PCT Pub. No.: WO2021/082645
PCT Pub. Date: May 6, 2021

(65) Prior Publication Data
US 2022/0013673 A1    Jan. 13, 2022

(30) Foreign Application Priority Data
Oct. 31, 2019  (CN) .......................... 201911055136.1

(51) Int. Cl.
*H01L 31/0236*  (2006.01)
*H10K 59/60*  (2023.01)
(Continued)

(52) U.S. Cl.
CPC ...... *H01L 31/02366* (2013.01); *H01L 31/202* (2013.01); *H10K 50/844* (2023.02); *H10K 59/60* (2023.02); *H10K 71/00* (2023.02)

(58) Field of Classification Search
CPC .......................... H01L 31/02366; H10K 59/60
See application file for complete search history.

(56) References Cited

U.S. PATENT DOCUMENTS

2016/0334699 A1    11/2016  Doi et al.
2019/0165017 A1*   5/2019  Qin ................. H01L 31/022466

FOREIGN PATENT DOCUMENTS

CN       104597531 A     5/2015
CN       107968100 A     4/2018
(Continued)

OTHER PUBLICATIONS

CN201911055136.1 First Office Action.

*Primary Examiner* — Daniel P Shook
(74) *Attorney, Agent, or Firm* — IPro, PLLC

(57) ABSTRACT

Disclosed in embodiments of the present disclosure are a display panel and a manufacturing method therefor, and a display apparatus. The display panel includes: a base substrate; an organic functional film layer provided on the base substrate; an insulating layer provided on the organic functional film layer, a plurality of dents distributed at intervals are provided on one side of the insulating layer distant from the organic functional film layer; and an amorphous silicon solar cell film layer provided at one side of the insulating layer distant from the organic functional film layer, the amorphous silicon solar cell film layer has the same morphology as the surface of the insulating layer where the dents are provided.

17 Claims, 2 Drawing Sheets

---

Forming the organic functional film layer on the base substrate — S101

Forming the insulating layer on the base substrate, the insulating layer is provided, on the side facing away from the organic functional film layer, with the plurality of pits distributed at intervals — S102

Forming the amorphous silicon solar cell film layer on the side, facing away from the organic functional film layer, of the insulating layer, wherein the amorphous silicon solar cell film layer has the same morphology as the surface, provided with the pits, of the insulating layer — S103

(51) Int. Cl.
*H01L 31/20* (2006.01)
*H10K 50/844* (2023.01)
*H10K 71/00* (2023.01)

(56) References Cited

FOREIGN PATENT DOCUMENTS

| CN | 109300969 A | 2/2019 |
| CN | 109841662 A | 6/2019 |
| CN | 110752224 A | 2/2020 |
| JP | 5241258 B2 | 7/2013 |

* cited by examiner

DISPLAY PANEL AND MANUFACTURING METHOD THEREFOR, AND DISPLAY APPARATUS

CROSS REFERENCE TO RELATED APPLICATION

The present disclosure is a National Stage of International Application No. PCT/CN2020/109853, filed Aug. 18, 2020, which claims the priority of Chinese Patent Application No. 201911055136.1, filed with the China National Intellectual Property Administration on Oct. 31, 2019 and entitled "Display Panel, Preparation Method Thereof and Display Device", the entire content of which is hereby incorporated by reference.

FIELD

The present disclosure relates to the technical field of display, in particular to a display panel, a preparation method thereof and a display device.

BACKGROUND

In the field of display, the integration of the solar cell on a light emitting surface of a display screen achieves low power consumption and reduced size of the whole machine. Moreover, through texturing the surface of a cell film layer, the reflection efficiency of the solar cell can be reduced, which can replace a circular polarizer to reduce the thickness of the display screen module. At present, as to the texturing of the surface of the solar cell film layer, punching and texturing are performed on a lower electrode of a PIN cell (which can be metal Mo), then a PIN cell film layer and an upper electrode ITO are prepared on the lower electrode, thereby replicating the structure of the lower electrode, and reducing the reflectivity of the PIN cell film layer and the upper electrode. However, the metal thickness of the lower electrode of the PIN cell is limited, the depth of the punching is restricted, while the width of the punching is larger, therefore, the width-depth ratio of the textured hole is too large, and the reflectivity reduction effect is poor, therefore, there is an urgent need to study how to reduce the reflection efficiency of the display screen.

SUMMARY

The present disclosure provides a display panel, including:
a base substrate;
an organic functional film layer disposed on the base substrate;
an insulating layer disposed on the organic functional film layer, the insulating layer is provided, on a side facing away from the organic functional film layer, with a plurality of pits distributed at intervals; and
an amorphous silicon solar cell film layer disposed on the side, facing away from the organic functional film layer, of the insulating layer, the amorphous silicon solar cell film layer has the same morphology as a surface, provided with the pits, of the insulating layer.

In some embodiments, the insulating layer comprises an encapsulating layer;
the encapsulating layer includes:
at least two inorganic film layers, and
at least one organic film layer;
the at least two inorganic film layers and the at least one organic film layer are stacked alternately in sequence, and
along a light emitting direction of the display panel, the organic film layer, at an outermost side of the light emitting direction in the encapsulating layer, is provided with the plurality of pits distributed at intervals.

In some embodiments, a depth of the pit is less than a thickness of the organic film layer.

In some embodiments, the insulating layer comprises an encapsulating layer and a resin film layer; the resin film layer is disposed on a side, facing away from the base substrate, of the encapsulating layer;
where the resin film layer is provided, on a side, facing away from the encapsulating layer, with the plurality of pits distributed at intervals.

In some embodiments, a ratio of an aperture size of the pit to a depth size of the pit is less than or equal to 1.

In some embodiments, the pits are distributed on the insulating layer at equal intervals.

In some embodiments, a thickness of the insulating layer is greater than 2 μl.

In some embodiments, the amorphous silicon solar cell film layer includes a lower electrode, a PIN film layer and an upper electrode which are stacked in sequence on the insulating layer.

The present disclosure further provides a display device, including the display panel provided in any of the above-mentioned embodiments.

The present disclosure further provides a method for preparing the display panel provided in any of the above embodiments, including:
forming the organic functional film layer on the base substrate;
forming the insulating layer on the base substrate, the insulating layer is provided, on the side facing away from the organic functional film layer, with the plurality of pits distributed at intervals; and
forming the amorphous silicon solar cell film layer on the side, facing away from the organic functional film layer, of the insulating layer, the amorphous silicon solar cell film layer has the same morphology as the surface, provided with the pits, of the insulating layer.

DETAILED DESCRIPTION OF THE EMBODIMENTS

Figure 1:
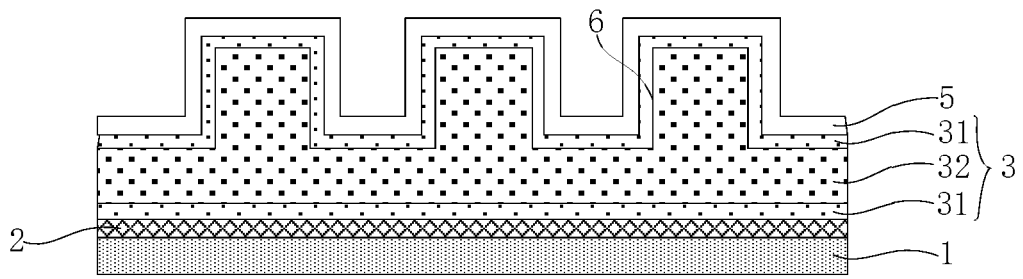
FIG. 1 is a structural schematic diagram of a display panel, provided by an embodiment of the present disclosure.

A clear and complete description will be given below on technical solutions in embodiments of the present disclosure in combination with accompanying drawings in embodiments of the present disclosure. Obviously, the described embodiments are merely part but not all of embodiments of the present disclosure. Based on the embodiments of the present disclosure, all the other embodiments obtained by those skilled in the art without any creative effort shall all fall within the protection scope of the present disclosure.

As shown in FIG. 1 to FIG. 4, embodiments of the present disclosure provide a display panel, including: a base substrate 1; an organic functional film layer 2 disposed on the base substrate 1; an insulating layer disposed on the organic functional film layer 2, the insulating layer is provided, on a side facing away from the organic functional film layer 2, with a plurality of pits 6 distributed at intervals; and an amorphous silicon solar cell film layer 5 disposed on the side, facing away from the organic functional film layer, of the insulating layer, the amorphous silicon solar cell film layer 5 has the same morphology as a surface, provided with the pits, of the insulating layer.

In the above display panel, the base substrate 1 is provided with an organic functional film layer 2 configured to emit light and realize the display function, an insulating layer is disposed on the organic functional film layer 2, a plurality of pits 6 distributed at intervals are disposed on the surface of a side, facing away from the organic functional film layer 2, of the insulating layer, and the plurality of pits 6 are distributed at intervals on the whole surface of the insulating layer, which is equivalent to performing texturing on the surface, such that the surface, provided with pits, of the insulating layer can form a textured surface. The amorphous silicon solar cell film layer 5 is disposed on the insulating layer, and the amorphous silicon solar cell film layer 5 is set along the morphology of the textured surface of the insulating layer, to completely replicate the morphology of the textured surface of the insulating layer. That is, the amorphous silicon solar cell film layer 5 has the same morphology as the textured surface of the insulating layer, and pit structures in one-to-one correspondence with the pits 6 are formed on a side, facing away from the insulating layer, of the amorphous silicon solar cell film layer 5. It can effectively reduce the reflectivity of the amorphous silicon solar cell film layer 5 to the ambient light, save the setting of a circular polarizer on the surface of the display panel, and reduce the thickness of the display panel.

In addition, since the textured surface is formed when the pits 6 are formed on the insulating layer, and the thickness of the insulating layer is large, that is, the thickness of the insulating layer is larger than the thickness of the amorphous silicon solar cell film layer 5, therefore, the thickness of the pit 6 can be deepened, then the width-depth ratio of the pit 6 can be small, the width-depth ratio of the pit structure of the amorphous silicon solar cell film layer 5 is small. Therefore, the smaller the width-depth ratio of the pit structure, the better the reflectivity reduction effect of the amorphous silicon solar cell film layer 5 to the ambient light. That is, when the pits 6 are formed on the insulating layer, pit structures with a small width-depth ratio are formed on the amorphous silicon solar cell film layer 5, then the reflectivity reduction effect of the amorphous silicon solar cell film layer 5 can be effectively improved, such that the amorphous silicon solar cell film layer 5 has a better reflectivity reduction effect. Moreover, the amorphous silicon solar cell film layer 5 is arranged along the morphology of the textured surface of the insulating layer, thereby effectively increasing the setting area of the surface, on the light emitting side of the display panel, of the amorphous silicon solar cell film layer 5, and improving the photoelectric conversion efficiency of the amorphous silicon solar cell film layer 5.

Therefore, in the above display panel, a plurality of pits 6 distributed at intervals are arranged on the surface of the insulating layer on the organic functional film layer 2 to form a textured surface, to perform texturing on the surface of the insulating layer. Moreover, the solar cell film layer on the insulating layer is set according to the morphology of the surface of the insulating layer provided with the pits, and the solar cell film layer has the same morphology as the surface, provided with the pits, of the insulating layer, to form a plurality of pit structures with a small width-depth ratio, thereby effectively improving the reflectivity reduction effect of the amorphous silicon solar cell film layer 5, realizing a better reflection reduction effect of the amorphous silicon solar cell film layer, and improving the photoelectric conversion efficiency of the amorphous silicon solar cell film layer.

In some embodiments, as to the setting of the above insulating layer, a plurality of selection manners are available, as shown below.

Manner I.

Figure 2:
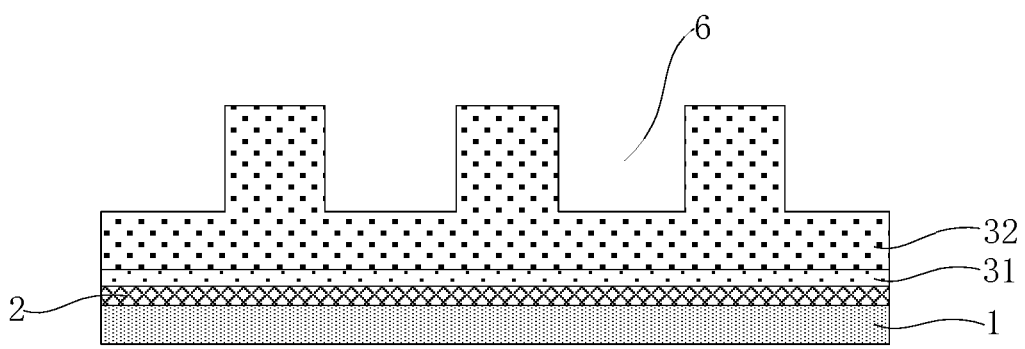
FIG. 2 is a structural schematic diagram of the pits in the display panel shown in FIG. 1.

As shown in FIG. 1 and FIG. 2, the insulating layer includes an encapsulating layer 3, the encapsulating layer 3 includes at least two inorganic film layers 31 and at least one organic film layer 32, the at least two inorganic film layers 31 and the at least one organic film layer 32 are stacked alternately in sequence, and along the light emitting direction of the display panel, a plurality of pits 6 distributed at intervals are arranged on the organic film layer 32 at the outermost side of the light emitting direction in the encapsulating layer 3 to form the insulating layer. That is, a plurality of pits 6 distributed at intervals are arranged on the organic film layer 32 at the outermost layer in the encapsulating layer 3 to form a textured surface, the thickness of the organic film layer 32 in encapsulating layers 3 is large, and the pits 6 with a large thickness can be prepared, and the pits 6 with a small width-depth ratio can be formed. It is beneficial for enabling the amorphous silicon solar cell film layer 5 to form pit structures with a small width-depth ratio, and improving the reflectivity reduction effect of the amorphous silicon solar cell film layer 5. Moreover, when the pits 6 with a small width-depth ratio are directly arranged in the organic film layer 32 in the encapsulating layer 3 in the display panel, no additional film layers are added, thereby being beneficial for reducing the overall thickness of the display panel.

In some embodiments, in manner I, the encapsulating layer 3 can be set with two inorganic film layers 31 and one organic film layer 32, the organic film layer 32 is arranged between two inorganic film layers 31, a plurality of pits 6 distributed at intervals are arranged on a side, facing towards the light emitting surface, of the organic film layer 32 to form a textured surface, and the inorganic film layer 31 on the organic film layer 32 is set according to the morphology of the textured surface of the organic film layer 32 to form the inorganic film layer 31 having the same morphology as the textured surface of the organic film layer 32. Or, the encapsulating layer 3 can also be provided with two inorganic film layers 31 and two organic film layers 32, the inorganic film layers 31 and the organic film layers 32 are stacked alternately, and along a light emitting direction, a plurality of pits 6 distributed at intervals are arranged on the surface of the organic film layer 32 on the outermost side among the two organic film layers 32 to texture the surface, where the setting of the alternating sequence of the inorganic film layer 31 and the organic film layer 32 is not defined; it should be noted that, the setting manner of the encapsulating layer 3 can also be other setting manners, which is not defined in the present embodiment.

To avoid influencing the encapsulating effect of the encapsulating layer 3, in manner I, the depth of the pit 6 is less than the thickness of the organic film layer 32, that is, the thickness of the pit 6 should be selected appropriately, when the width-depth ratio of the pit 6 is ensured to be small, the encapsulating effect of the encapsulating layer 3 should also be ensured to be not influenced.

Manner II.

Figure 3:
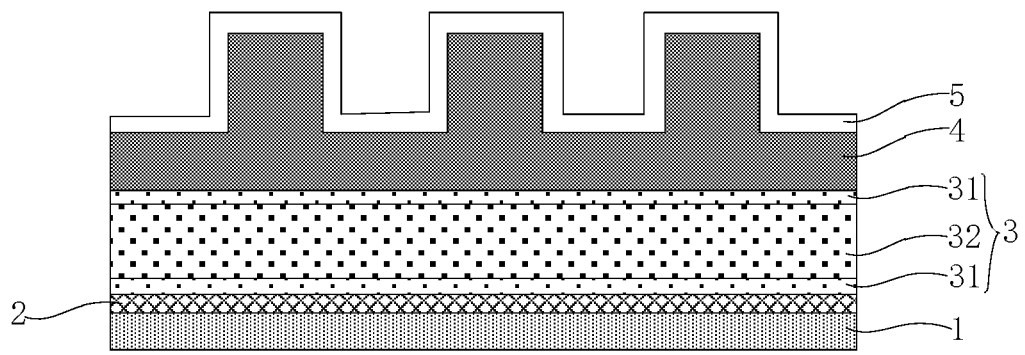
FIG. 3 is another structural schematic diagram of a display panel, provided by an embodiment of the present disclosure.
Figure 4:
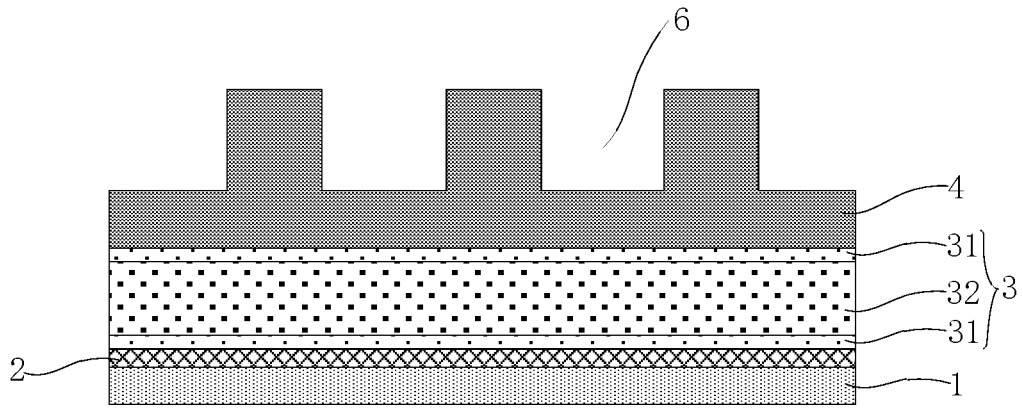
FIG. 4 is a structural schematic diagram of the pits in the display panel shown in FIG. 3.

As shown in FIG. 3 and FIG. 4, the insulating layer includes an encapsulating layer and a resin film layer; the encapsulating layer 3 is disposed on the organic functional film layer 2, the resin film layer 4 is disposed on the encapsulating layer 3, the resin film layer 4 is provided, on a side, facing away from the encapsulating layer 3, with the plurality of pits 6 distributed at intervals, to form an insulating layer. That is, a resin film layer 4 can be added on the encapsulating layer 3, a plurality of pits 6 distributed at intervals can be arranged on the resin film layer 4, that is, the resin film layer 4 forms the above insulating layer, a resin film layer 4 is arranged on the encapsulating layer 3, the thickness of the resin film layer 4 can be set appropriately, such that the pit 6 has a small width-depth ratio, and, the pits 6 are prepared on the resin film layer 4, thereby not only ensuring that the pits 6 have a small width-depth ratio, but also having no influence on the encapsulating layer 3.

In some embodiments, in the above display panel, the ratio of the aperture size of the pit to the depth size of the pit 6 is less than or equal to 1. That is, the width-depth ratio of the pit 6 can be less than or equal to 1, such that the width-depth ratio of the pit 6 is less than or equal to 1, then the reflectivity reduction effect of the amorphous silicon solar cell film layer 5 on the insulating layer can be better. In some embodiments, the width-depth ratio of the pit 6 can be set to 1, 0.95, 0.9, 0.85, 0.8, 0.7 or other numerical values, which is not limited in the present embodiment.

In some embodiments, the pits 6 are distributed on the insulating layer at equal intervals, when the pits 6 are arranged at equal intervals on the insulating layer, and the overall reflectivity reduction effect of the light emitting surface of the display panel can be uniform, thereby being beneficial for better display.

In the above display panel, the thickness of the insulating layer can be set to be greater than 2 µm, and through appropriate setting of the thickness of the insulating layer, not only pits 6 with a small width-depth ratio can be prepared, but also the overall thickness of the display panel can be ensured to be small, thereby avoiding increasing the thickness of the display panel.

In some embodiments, in the above display panel, the amorphous silicon solar cell film layer 5 includes a lower electrode, a PIN film layer and an upper electrode which are stacked in sequence on the insulating layer. The lower electrode can be a metal film layer, the metal film layer can be a metal Mo film layer, and the upper electrode can be an ITO film layer.

The present disclosure further provides a display device, including any one of display panel provided in the above embodiment.

Figure 5:
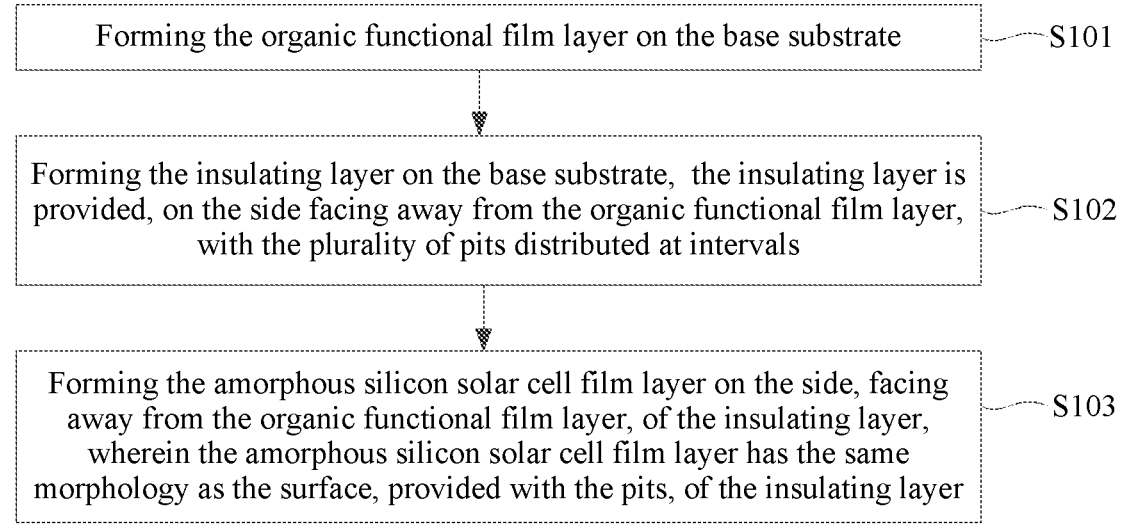
FIG. 5 is a schematic diagram of a preparation method of a display panel, provided by an embodiment of the present disclosure.

Based on the same inventive concept, the present disclosure further provides a preparation method of any one of display panel provided in the above embodiment, as shown in FIG. 5, the preparation method includes:

step S101, forming the organic functional film layer on the base substrate;

step S102, forming the insulating layer on the base substrate, the insulating layer is provided, on the side facing away from the organic functional film layer, with the plurality of pits distributed at intervals, such that the surface of the insulating layer forms a textured surface; and step S103, forming the amorphous silicon solar cell film layer on the side, facing away from the organic functional film layer, of the insulating layer, the amorphous silicon solar cell film layer has the same morphology as the surface, provided with the pits, of the insulating layer.

In the above preparation method, an organic functional film layer, an insulating layer and an amorphous silicon solar cell film layer can be formed in sequence on the base substrate through a composition process, a plurality of pits distributed at intervals can be formed on the insulating layer through the exposure development technology. As to the display panel prepared with the above preparation method, a plurality of pits distributed at intervals are prepared on the insulating layer, and a plurality of pits are distributed at intervals on the whole surface of the insulating layer, which is equivalent to performing texturing on the surface, such that the surface, provided with pits, of the insulating layer can form a textured surface. The amorphous silicon solar cell film layer is arranged on the insulating layer, and the amorphous silicon solar cell film layer is set along the morphology of the textured surface of the insulating layer, to completely replicate the morphology of the textured surface of the insulating layer. That is, the amorphous silicon solar cell film layer has the same morphology as the textured surface of the insulating layer, and pit structures in one-to-one correspondence with the pits are formed on a side, facing away from the insulating layer, of the amorphous silicon solar cell film layer. It can effectively reduce the reflectivity of the amorphous silicon solar cell film layer to the ambient light, save the setting of a circular polarizer on the surface of the display panel, and reduce the thickness of the display panel.

In addition, since the textured surface is formed when the pits are formed on the insulating layer, and the thickness of the insulating layer is large, that is, the thickness of the insulating layer is larger than the thickness of the amorphous silicon solar cell film layer, therefore, the depth of the pit can be deepened, then the width-depth ratio of the pit can be small, the width-depth ratio of the pit structure of the amorphous silicon solar cell film layer is small. Therefore, the smaller the width-depth ratio of the pit structure, the better the reflectivity reduction effect of the amorphous silicon solar cell film layer to the ambient light. That is, when the pits are formed on the insulating layer, pit structures with a small width-depth ratio are formed on the amorphous silicon solar cell film layer, then the reflectivity reduction effect of the amorphous silicon solar cell film layer can be effectively improved, such that the amorphous silicon solar cell film layer has a better reflectivity reduction effect. Moreover, the amorphous silicon solar cell film layer is arranged along the morphology of the textured surface of the insulating layer, thereby effectively increasing the setting area of the surface, on the light emitting side of the display panel, of the amorphous silicon solar cell film layer, and improving the photoelectric conversion efficiency of the amorphous silicon solar cell film layer.

Obviously, those skilled in the art can make various modifications and variations to embodiments of the present disclosure without departing from the spirit and scope of the present disclosure. Therefore, the present disclosure is also intended to encompass these modifications and variations thereto so long as the modifications and variations come into the scope of the claims of the present disclosure and their equivalents.

What is claimed is:

1. A display panel, comprising:
    a base substrate;
    an organic functional film layer disposed on the base substrate;
    an insulating layer disposed on the organic functional film layer, wherein the insulating layer is provided, on a side facing away from the organic functional film layer, with a plurality of pits distributed at intervals; and
    an amorphous silicon solar cell film layer disposed on the side, facing away from the organic functional film layer, of the insulating layer, wherein the amorphous silicon solar cell film layer has the same morphology as a surface, provided with the pits, of the insulating layer.

2. The display panel of claim 1, wherein the insulating layer comprises an encapsulating layer;
    the encapsulating layer comprises:
    at least two inorganic film layers, and
    at least one organic film layer;
    wherein the at least two inorganic film layers and the at least one organic film layer are stacked alternately in sequence, and
    along a light emitting direction of the display panel, the organic film layer, at an outermost side of the light emitting direction, in the encapsulating layer, is provided with the plurality of pits distributed at intervals.

3. The display panel of claim 2, wherein a depth of the pit is less than a thickness of the organic film layer.

4. The display panel of claim 1, wherein the insulating layer comprises an encapsulating layer and a resin film layer;
    the resin film layer is disposed on a side, facing away from the base substrate, of the encapsulating layer;
    wherein the resin film layer is provided, on a side facing away from the encapsulating layer, with the plurality of pits distributed at intervals.

5. The display panel of claim 1, wherein a ratio of an aperture size of the pit to a depth size of the pit is less than or equal to 1.

6. The display panel of claim 1, wherein the pits are distributed in the insulating layer at equal intervals.

7. The display panel of claim 1, wherein a thickness of the insulating layer is greater than 2 µm.

8. The display panel of claim 1, wherein the amorphous silicon solar cell film layer comprises a lower electrode, a PIN film layer and an upper electrode which are stacked in sequence on the insulating layer.

9. A display device, comprising the display panel of claim 1.

10. The display device of claim 9, wherein the insulating layer comprises an encapsulating layer;
    the encapsulating layer comprises:
    at least two inorganic film layers, and
    at least one organic film layer;
    wherein the at least two inorganic film layers and the at least one organic film layer are stacked alternately in sequence, and
    along a light emitting direction of the display panel, the organic film layer, at an outermost side of the light emitting direction, in the encapsulating layer, is provided with the plurality of pits distributed at intervals.

11. The display device of claim 10, wherein a depth of the pit is less than a thickness of the organic film layer.

12. The display device of claim 9, wherein the insulating layer comprises an encapsulating layer and a resin film layer; the resin film layer is disposed on a side, facing away from the base substrate, of the encapsulating layer;
    wherein the resin film layer is provided, on a side facing away from the encapsulating layer, with the plurality of pits distributed at intervals.

13. The display device of claim 9, wherein a ratio of an aperture size of the pit to a depth size of the pit is less than or equal to 1.

14. The display device of claim 9, wherein the pits are distributed in the insulating layer at equal intervals.

15. The display device of claim 9, wherein a thickness of the insulating layer is greater than 2 µm.

16. The display device of claim 9, wherein the amorphous silicon solar cell film layer comprises a lower electrode, a PIN film layer and an upper electrode which are stacked in sequence on the insulating layer.

17. A method for preparing the display panel of claim 1, comprising:
    forming the organic functional film layer on the base substrate;
    forming the insulating layer on the base substrate, wherein the insulating layer is provided, on the side facing away from the organic functional film layer, with the plurality of pits distributed at intervals; and
    forming the amorphous silicon solar cell film layer on the side, facing away from the organic functional film layer, of the insulating layer, wherein the amorphous silicon solar cell film layer has the same morphology as the surface, provided with the pits, of the insulating layer.

* * * * *